US012652935B2

(12) United States Patent
Won et al.

(10) Patent No.: US 12,652,935 B2
(45) Date of Patent: Jun. 9, 2026

(54) DISPLAY DEVICE AND ELECTRONIC DEVICE INCLUDING THE SAME

(71) Applicant: Samsung Display Co., LTD., Yongin-si (KR)

(72) Inventors: Byeong-Hee Won, Incheon (KR); Youngchan Kim, Incheon (KR); Yong Seok Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 613 days.

(21) Appl. No.: 17/982,597

(22) Filed: Nov. 8, 2022

(65) Prior Publication Data

US 2023/0157121 A1    May 18, 2023

(30) Foreign Application Priority Data

Nov. 12, 2021    (KR) ........................ 10-2021-0155378

(51) Int. Cl.

| | |
|---|---|
| *H10K 50/844* | (2023.01) |
| *H10K 50/854* | (2023.01) |
| *H10K 50/86* | (2023.01) |
| *H10K 59/13* | (2023.01) |
| *H10K 59/38* | (2023.01) |

(Continued)

(52) U.S. Cl.
CPC .......... *H10K 59/877* (2023.02); *H10K 59/38* (2023.02); *H10K 59/50* (2023.02); *H10K 59/8792* (2023.02); *H10K 59/8793* (2023.02)

(58) Field of Classification Search
CPC .... G06F 1/1626; G06F 1/1637; G06F 1/1643; H10K 59/873; H10K 59/8793; H10K 59/8792; H10K 59/871; H10K 59/8791; H10K 59/8794; H10K 50/84; H10K 2102/311; H10K 71/191; H10K 50/844; H10K 50/854; H10K 50/86; H10K 59/877; H10K 59/38; H10K 59/50; H10K 59/13;

(Continued)

(56) References Cited

U.S. PATENT DOCUMENTS

| | | | |
|---|---|---|---|
| 2009/0295297 A1 | 12/2009 | Hwang et al. | |
| 2016/0358997 A1* | 12/2016 | Bae ...................... | H10K 59/124 |

(Continued)

FOREIGN PATENT DOCUMENTS

| | | |
|---|---|---|
| KR | 20090125416 A | 12/2009 |
| KR | 20100066226 A | 6/2010 |

(Continued)

OTHER PUBLICATIONS

Korean Office Action for Korean Patent Application No. KR 10-2021-0155378 dated Jan. 22, 2026.

*Primary Examiner* — Omar F Mojaddedi
(74) *Attorney, Agent, or Firm* — CANTOR COLBURN LLP

(57) ABSTRACT

A display device includes a display area including a light emitting area and a light blocking area which is adjacent to the light emitting area, a peripheral area adjacent to the display area, a first light emitting element which is in the light emitting area and emits a first light having a first wavelength range, and a color filter layer which is in the light emitting area and includes a photochromic material which is discolored by a second light having a second wavelength range different from the first wavelength range.

10 Claims, 13 Drawing Sheets

(51) Int. Cl.
    *H10K 59/50*          (2023.01)
    *H10K 59/80*          (2023.01)

(58) Field of Classification Search
    CPC ............. H10K 59/35; H10K 59/80517; H10K
                    59/80524; H10K 59/879; Y02E 10/549
    See application file for complete search history.

(56)                    References Cited

U.S. PATENT DOCUMENTS

| | | | |
|---|---|---|---|
| 2017/0023806 A1* | 1/2017 | Wehlus | ................. G02F 1/0126 |
| 2019/0377229 A1 | 12/2019 | Song et al. | |
| 2020/0058714 A1* | 2/2020 | Huang | ................. H10K 59/879 |
| 2020/0266243 A1 | 8/2020 | Kim et al. | |
| 2021/0191175 A1* | 6/2021 | Niu | ................... G02F 1/133512 |
| 2021/0343794 A1 | 11/2021 | Lee et al. | |
| 2022/0165812 A1* | 5/2022 | Shin | ........................ H10K 59/50 |
| 2022/0365618 A1* | 11/2022 | Hou | ................... H10K 59/8792 |

FOREIGN PATENT DOCUMENTS

| | | |
|---|---|---|
| KR | 10-0987905 B1 | 10/2010 |
| KR | 1020140055165 A | 5/2014 |
| KR | 20190140548 A | 12/2019 |
| KR | 20200100903 A | 8/2020 |
| KR | 1020200095985 A | 8/2020 |
| KR | 20210134161 A | 11/2021 |

* cited by examiner

CW
230
192
220
191
140
BM
ENC
PDL
IL
100

DISPLAY DEVICE AND ELECTRONIC DEVICE INCLUDING THE SAME

This application claims priority to Korean Patent Application No. 10-2021-0155378, filed on Nov. 12, 2021, and all the benefits accruing therefrom under 35 U.S.C. § 119, which is hereby incorporated by reference for all purposes as if fully set forth herein.

BACKGROUND

1. Field

Embodiments relate generally to a display device. More particularly, embodiments relate to a display device and an electronic device including the same.

2. Description of the Related Art

With the advancement of technology, display devices that are smaller in size and lighter in weight, and have better performance, are being provided. Previously, conventional cathode ray tube (CRT) televisions have been widely used as display devices with many advantages in terms of performance and price.

A display device that overcomes the shortcomings of the CRT television in terms of miniaturization or portability and has advantages such as miniaturization, weight reduction and low power consumption, is attracting attention. For example, the display device may include a plasma display device, a liquid crystal display device, an organic light emitting display device, and a quantum dot display device. A display device having high light emitting efficiency and low reflectance of external light is being developed.

SUMMARY

One or more embodiment provides a display device with improved display quality.

One or more embodiment provides an electronic device including the display device.

A display device according to an embodiment of the invention includes a substrate including a display area including light emitting areas and a light blocking area, and a peripheral area surrounding at least a portion of the display area, a light emitting element in each of the light emitting areas on the substrate and emitting a first light having a first wavelength range, and a color filter layer in the light emitting areas on the light emitting element and including a photochromic material that is discolored by a second light having a second wavelength range different from the first wavelength range.

In an embodiment, the display device may further include a polarizing member in the display area and the peripheral area on the color filter layer.

In an embodiment, the first light may be visible light and the second light may be ultraviolet light incident from an outside.

In an embodiment, the display device may further include a light guide layer in the display area and the peripheral area on the light emitting element, and transmitting the second light incident from the peripheral area to the display area.

In an embodiment, the display device may further include an encapsulation structure in the display area and the peripheral area on the light emitting element and a light blocking layer in the light blocking area on the encapsulation structure and partially overlapping the color filter layer.

In an embodiment, the display device may further include a plurality of scattering patterns between the encapsulation structure and the light guide layer, and overlapping the color filter layer.

In an embodiment, each of the scattering patterns may include a plurality of light scattering particles and an insulating film in which the light scattering particles are mixed.

In an embodiment, the display device may further include a light source element on a side of the light guide layer and emitting the second light.

In an embodiment, the first light may be visible light and the second light may be ultraviolet light.

In an embodiment, the display device may further include a light source element in the peripheral area on the substrate and emitting the second light. The first light may be visible light and the second light may be ultraviolet light.

A display device according to an embodiment of the invention may include a substrate including a display area including light emitting areas and a light blocking area, and a peripheral area surrounding at least a portion of the display area, a light emitting element in each of the light emitting areas on the substrate, and a color filter layer in the light emitting areas on the light emitting element and including an electrochromic material that is discolored by a voltage applied thereto.

In an embodiment, the display device may further include a first electrode in the display area on the light emitting element and a second electrode in the display area on the color filter layer.

In an embodiment, each of the first electrode and the second electrode may apply the voltage to the color filter layer.

In an embodiment, each of the first electrode and the second electrode may include a transparent conductive material.

In an embodiment, the display device may further include an encapsulation structure in the display area and the peripheral area on the light emitting element and a light blocking layer in the light blocking area on the encapsulation structure and partially overlapping the color filter layer.

An electronic device according to an embodiment of the invention a display device including a substrate including a display area including light emitting areas and a light blocking area, and a peripheral area surrounding at least a portion of the display area, a light emitting element in each of the light emitting areas on the substrate and emitting a first light having a first wavelength range, and a color filter layer in the light emitting areas on the light emitting element and including a photochromic material that is discolored by a second light having a second wavelength range different from the first wavelength range, and an illumination sensor that detects an external illuminance relative to the electronic device.

In an embodiment, the photochromic material may change color based on the external illuminance which is detected by the illumination sensor.

In an embodiment, the display device may further include a light guide layer in the display area and the peripheral area on the light emitting element, and transmitting the second light incident from the peripheral area to the display area.

In an embodiment, the display device may further include a light source element on a side of the light guide layer and emitting the second light.

In an embodiment, the first light may be visible light and the second light may be ultraviolet light.

A display device according to an embodiment of the invention may include a color filter layer including a photochromic material that is discolored by external light (e.g., ultraviolet light) incident from an outside of the display device. Accordingly, reflectance due to external light incident from the outside of the display device may be further reduced.

In addition, a display device according to an embodiment of the invention may include a color filter layer including a photochromic material that is discolored by light (e.g., ultraviolet light) emitted from an internal or external light source element, or an electrochromic material that is discolored by voltage applied thereto. Accordingly, reflectance due to external light incident from the outside of the display device may be further reduced. In addition, power consumption of the display device may be reduced.

BRIEF DESCRIPTION OF THE DRAWINGS

Illustrative, non-limiting embodiments will be more clearly understood from the following detailed description in conjunction with the accompanying drawings.

FIGS. 3A and 3B are cross-sectional views illustrating a display device according to an embodiment.

FIGS. 4A and 4B are cross-sectional views illustrating a display device according to an embodiment.

FIGS. 6A and 6B are cross-sectional views illustrating a display device according to an embodiment.

FIGS. 7A and 7B are cross-sectional views illustrating a display device according to an embodiment.

DETAILED DESCRIPTION

Figure 1:
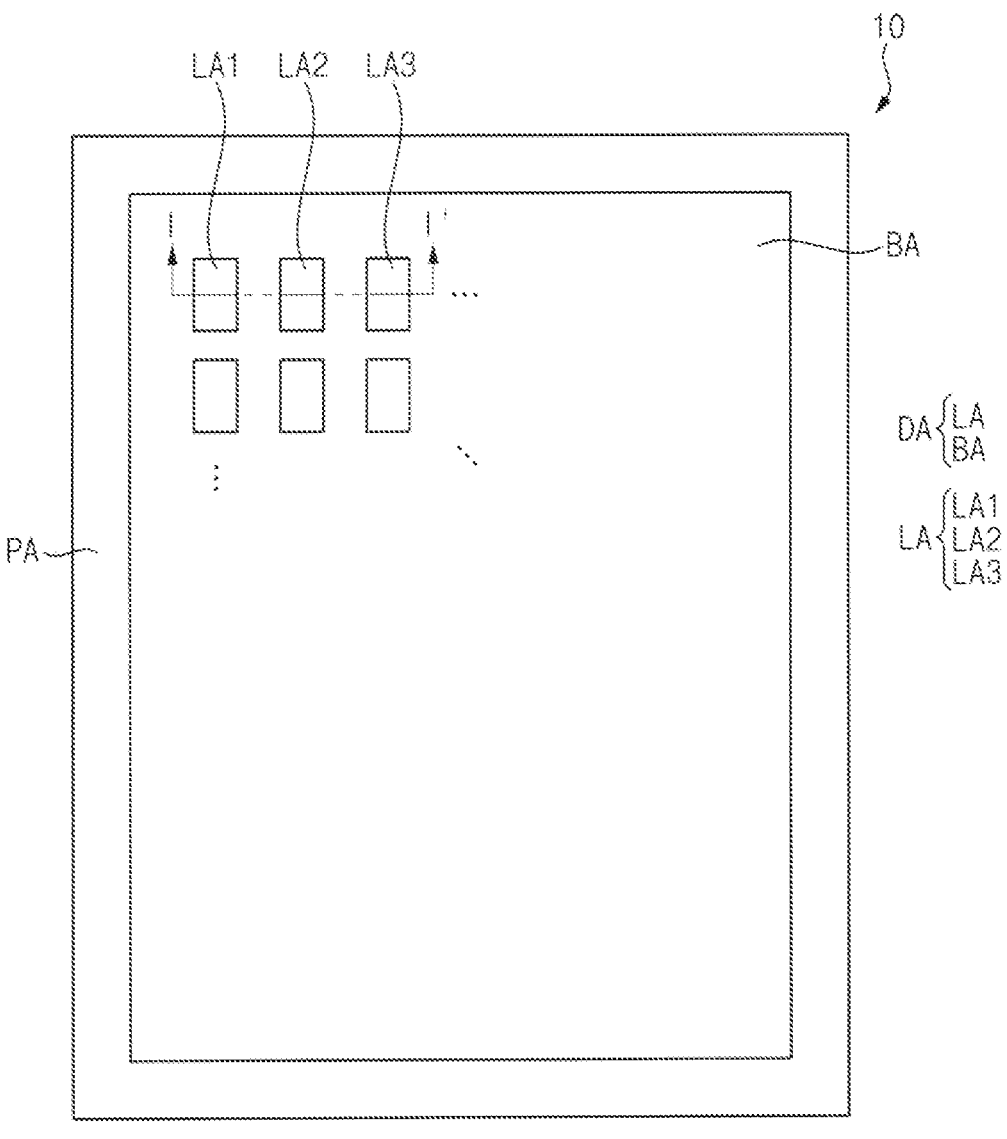
FIG. 1 is a plan view illustrating a display device according to an embodiment.
Figure 1:
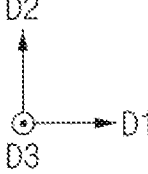

Hereinafter, embodiments of the present disclosure will be explained in detail with reference to the accompanying drawings. The same reference numerals are used for the same components in the drawings, and redundant descriptions of the same components will be omitted.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, a reference number may indicate a singular element or a plurality of the element. For example, a reference number labeling a singular form of an element within the drawing figures may be used to reference a plurality of the singular element within the text of specification.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device 10 according to an embodiment.

Referring to FIG. 1, the display device 10 according to an embodiment may include a display area DA and a peripheral area PA. A plurality of pixels may be disposed in the display area DA. An image may be displayed through the pixels in the display area DA. An image may not be displayed in the peripheral area PA (e.g., a non-display area). The peripheral area PA may be located outside the display area DA, such as being adjacent to the display area DA. For example, the peripheral area PA may surround the display area DA in a plan view.

The display area DA may include a plurality of light emitting areas LA and a light blocking area BA. A pixel among the plurality of pixels may be disposed in each of the light emitting areas LA. For example, the light emitting areas LA may be arranged in a matrix form along a first direction D1 and a second direction D2 which intersects the first direction D1. For example, the first direction D1 may be perpendicular to the second direction D2. The light blocking area BA may surround the light emitting areas LA in the plan view. A thickness or thickness direction of the display device 10 and various components or layers thereof may be defined along a third direction D3 crossing each of the first direction D1 and the second direction D2. Various components or layers of the display device 10 may include a display area DA and a peripheral area PA corresponding to those described above.

The light emitting areas LA may include a first light emitting area LA1, a second light emitting area LA2, and a third light emitting area LA3. A light emitting element 300 (of FIG. 2A) may be disposed in each of the first light emitting area LA1, the second light emitting area LA2, and the third light emitting area LA3. The light emitting element 300 may emit a first light L1 having a first wavelength range. The first light L1 may be visible light. In an embodiment, red light may be emitted from the first light emitting area LA1, green light may be emitted from the second light emitting area LA2, and blue light may be emitted from the third light emitting area LA3.

A light blocking layer BM (of FIG. 2A) may be disposed in the light blocking area BA. In an embodiment, the light blocking layer BM may be a black matrix. The light blocking layer BM may prevent light (e.g., red light, green light, and blue light) emitted from the light emitting areas LA from being mixed with each other. Light may not be emitted to the light blocking area BA. In an embodiment, the light blocking layer BM may not be disposed in the light blocking area BA.

However, although the display device 10 of the invention is limited to an organic light emitting display device (OLED), the configuration of the invention is not limited thereto. In other embodiments, the display device 10 may include a liquid crystal display device (LCD), a field emission display device (FED), a plasma display device (PDP), an electrophoretic display device (EPD), an inorganic light emitting display device (ILED), or a quantum dot display device.

Figure 2A:
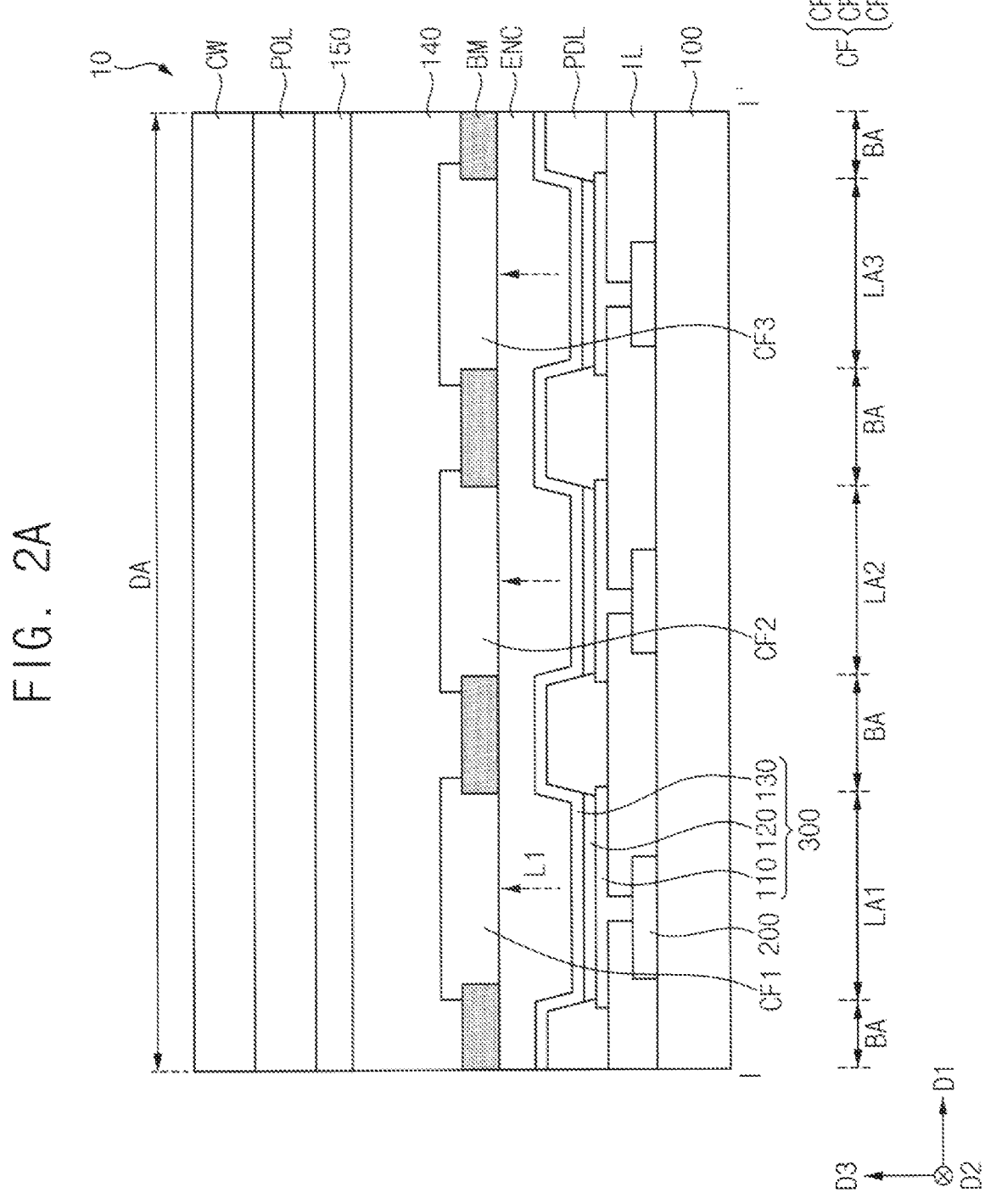
FIGS. 2A and 2B are cross-sectional views taken along line I-I' of FIG. 1.
Figure 2B:
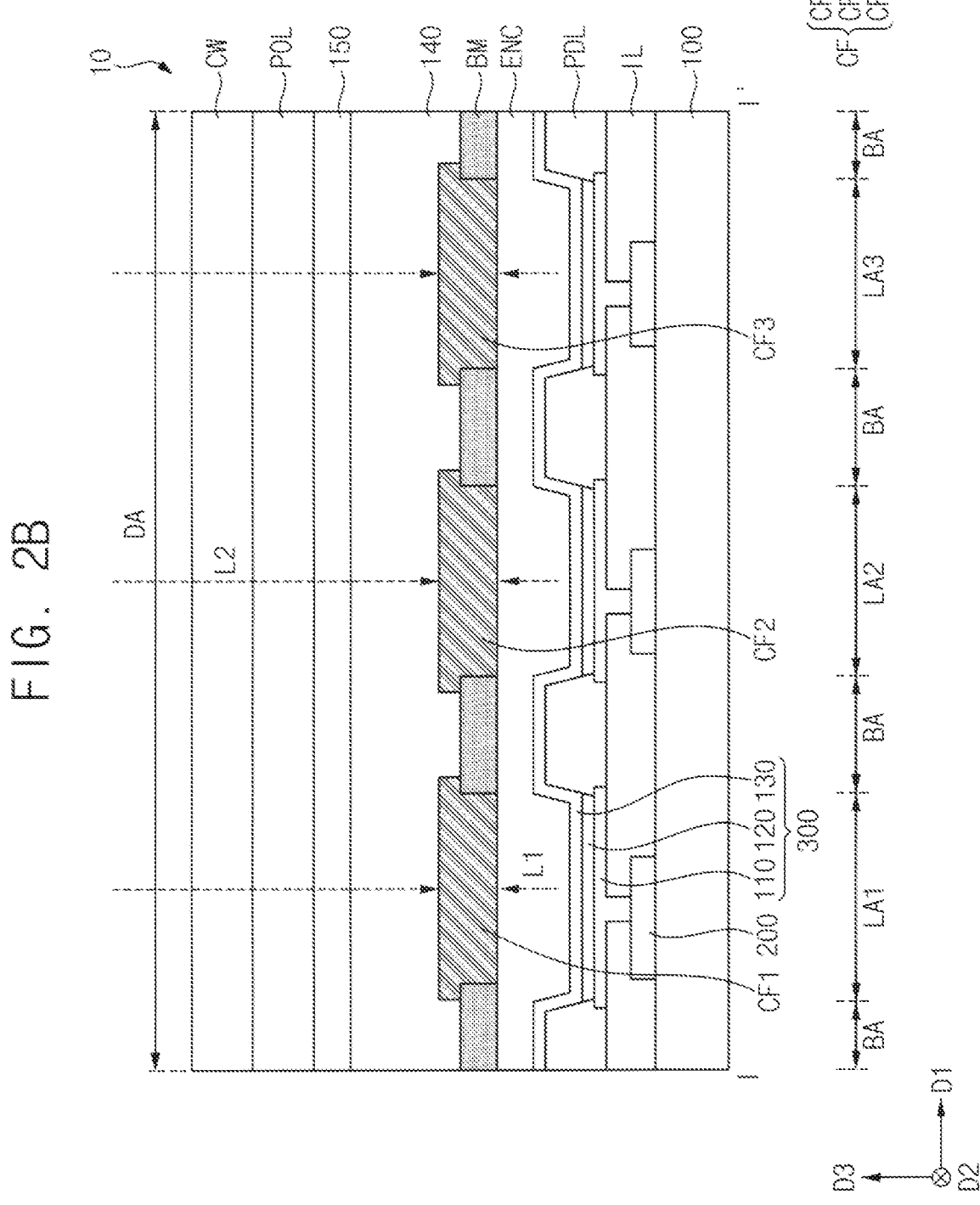

FIGS. 2A and 2B are cross-sectional views taken along line I-I' of FIG. 1. For example, FIG. 2A may show the display device 10 in a first mode state, and FIG. 2B may show the display device 10 in a second mode state. Here, the first mode state may be a mode when the display device 10 is located in an indoor environment (e.g., indoor mode), and the second mode state may be a mode when the display device 10 is located in an outdoor environment (e.g., outdoor mode).

Referring to FIGS. 2A and 2B, the display device 10 according to an embodiment of the invention may include a substrate 100, an insulating structure IL, a driving element 200, a pixel defining layer PDL, a light emitting element 300 (e.g., a first light emitting element), an encapsulation structure ENC, a color filter layer CF, a planarization layer 140, an adhesive member 150, a polarizing member POL, and a cover window CW. Here, the light emitting element 300 may include a lower electrode 110, a light emitting layer 120, and an upper electrode 130. The color filter layer CF may include a first color filter CF1, a second color filter CF2, and a third color filter CF3.

As described above, the display device 10 may include a display area DA and a peripheral area PA. As the display device 10 includes the display area DA and the peripheral area PA, the substrate 100 may also include the display area DA and the peripheral area PA.

The substrate 100 may include a transparent material or an opaque material. For example, the substrate 100 may be formed of (or include) a transparent resin substrate. Examples of the transparent resin substrate that can be used as the substrate may include a polyimide substrate. In this case, the polyimide substrate may include a first polyimide layer, a barrier film layer, a second polyimide layer, and the like. In an embodiment, the substrate 100 may include a quartz substrate, a synthetic quartz substrate, a calcium fluoride substrate, an F-doped quartz substrate, a soda-lime glass substrate, a non-alkali glass substrate, and the like. These may be used alone or in combination with each other.

A buffer layer (not shown) may be disposed on the substrate 100. The buffer layer may be entirely disposed in the display area DA and the peripheral area PA (e.g., disposed in an entirety of the display area DA and the peripheral area PA). The buffer layer may prevent diffusion of metal atoms or impurities from the substrate 100 to the driving element 200. In addition, when the surface of the substrate 100 is not uniform, the buffer layer may improve the flatness of the surface of the substrate 100. For example, the buffer layer may include an organic material or an inorganic material. Selectively, the buffer layer may be omitted.

The driving element 200 may be disposed in the display area DA on the substrate 100. The driving element 200 may be disposed in each of the first light emitting area LA1, the second light emitting area LA2, and the third light emitting area LA3. In an embodiment, a semiconductor layer of the driving element 200 may include amorphous silicon, polycrystalline silicon, or a metal oxide semiconductor. Examples of materials that can be used for the metal oxide semiconductor may include indium (In), gallium (Ga), tin (Sn), zirconium (Zr), vanadium (V), hafnium (Hf), cadmium (Cd), germanium (Ge), chromium (Cr), titanium (Ti), zinc (Zn), and the like. These may be used alone or in combination with each other.

The insulating structure IL may be disposed on the driving element 200. The insulating structure IL may cover the driving element 200. The insulating structure IL may include an inorganic insulating layer, an organic insulating layer, and the like. For example, the inorganic insulating layer may include silicon oxide, silicon nitride, silicon carbide, silicon oxynitride, silicon oxycarbide, and the like. In addition, the organic insulating layer includes a photoresist, a polyacryl-based resin, a polyimide-based resin, a polyamide-based resin, a siloxane-based resin, an acryl-based resin, an epoxy-based resin, and the like. Each of these may be used alone or in combination with each other.

The lower electrode 110 may be disposed in the display area DA on the insulating structure IL. The lower electrode 110 may be disposed in each of the first light emitting area LA1, the second light emitting area LA2, and the third light emitting area LA3. The lower electrode 110 may be electrically connected to the driving element 200, to connect the light emitting element 300 to the driving element 200. For example, the lower electrode 110 may include a metal, an alloy, a conductive metal oxide, a conductive metal nitride, a transparent conductive material, and the like. These may be used alone or in combination with each other. In an embodiment, the lower electrode 110 may be an anode electrode.

The pixel defining layer PDL may be disposed on the insulating structure IL. The pixel defining layer PDL may have (or define) openings exposing a portion of the lower electrode 110 to outside the pixel defining layer PDL. For example, each of the openings may expose a central portion of the lower electrode 110. The pixel defining layer PDL may cover a periphery of the lower electrode 110. For example, the pixel defining layer PDL may include an organic insulating material or an inorganic insulating material. In an embodiment, the pixel defining layer PDL may include an organic insulating material. Examples of the organic insulating material that can be used as the pixel defining layer PDL may include photoresists, polyacrylic resins, polyimide resins, polyamide resins, siloxane resins, acrylic resins, epoxy resins, and the like. These may be used alone or in combination with each other.

In an embodiment, the pixel defining layer PDL may further include a black pigment or a black dye having a high light absorption. For example, carbon black or the like may be used as the black pigment or the black dye. However, the material of the black pigment or the black dye is not limited thereto.

The light emitting layer 120 may be disposed on the lower electrode 110 exposed by each of the openings. That is, the light emitting layer 120 may be disposed inside each of the openings. The light emitting layer 120 may include an organic light emitting material emitting the first light L1 having the first wavelength range. The first light L1 may be visible light. For example, the light emitting layer 120 may include a low molecular weight organic compound or a high molecular weight organic compound.

The upper electrode 130 may be disposed on the light emitting layer 120. The upper electrode 130 may be entirely disposed in the display area DA (e.g., in an entirety of the display area DA). For example, the upper electrode 130 may include a metal, an alloy, a conductive metal oxide, a conductive metal nitride, a transparent conductive material, and the like. These may be used alone or in combination with each other. In an embodiment, the upper electrode 130 may be a cathode electrode.

Accordingly, the light emitting element 300 including the lower electrode 110, the light emitting layer 120 and the upper electrode 130 may be disposed in the display area DA on the substrate 100. The light emitting element 300 may be disposed in each of the first light emitting area LA1, the second light emitting area LA2, and the third light emitting area LA3. The light emitting element 300 may emit the first light L1 having a first wavelength range. The first light L1 may be visible light (e.g., red light, green light, and blue light). For example, the light emitting element 300 disposed in the first light emitting area LA1 emits red light, the light emitting element 300 disposed in the second light emitting area LA2 emits green light, and the light emitting element 300 disposed in the third light emitting area LA3 may emit blue light. The light emitting element 300 may be driven by the driving element 200.

The encapsulation structure ENC may be disposed on the upper electrode 130. The encapsulation structure ENC may be entirely disposed in the display area DA and the peripheral area PA. The encapsulation structure ENC may cover the light emitting element 300 and may protect the light emitting element 300 from external impurities.

The encapsulation structure ENC may include at least one inorganic encapsulation layer and at least one organic encapsulation layer. For example, the encapsulation structure ENC may include a first inorganic encapsulation layer, an organic encapsulation layer disposed on the first inorganic encapsulation layer, and a second inorganic encapsulation layer disposed on the organic encapsulation layer.

The first inorganic encapsulation layer may prevent the light emitting element 300 from being deteriorated due to penetration of moisture, oxygen, or the like. In addition, the first inorganic encapsulation layer may function to protect the light emitting element 300 from external impact. For example, the first inorganic encapsulation layer may include an inorganic insulating material having flexibility.

The organic encapsulation layer may improve the flatness of the display device 10 and may protect the light emitting element 300 together with the first inorganic encapsulation layer. For example, the organic encapsulation layer may include an organic insulating material having flexibility.

The second inorganic encapsulation layer, together with the first inorganic encapsulation layer, may prevent the light emitting element 300 from being deteriorated due to penetration of moisture, oxygen, or the like. In addition, the second inorganic encapsulation layer may also function to protect the light emitting element 300 together with the first inorganic encapsulation layer and the organic encapsulation layer from external impact. For example, the second inorganic encapsulation layer may include an inorganic insulating material having flexibility.

The light blocking layer BM may be disposed in the light blocking area BA on the encapsulation structure ENC. The light blocking layer BM may include a light blocking material. The light blocking layer BM may prevent light (e.g., red light, green light, and blue light) emitted from the light emitting areas LA from being mixed with each other. The light blocking layer BM may have a plurality of openings corresponding to the light emitting layer 120. That is, solid portions of the light blocking material may be spaced apart from each other to define the openings therebetween. In an embodiment, the light blocking layer BM may include a black organic material mixed with a black pigment, chromium oxide mixed with a black pigment, and the like.

The color filter layer CF may be disposed in the display area DA, on the encapsulation structure ENC. The color filter layer CF may be disposed in the first, second, and third light emitting areas LA1, LA2, and LA3.

As described above, the color filter layer CF may include the first color filter CF1, the second color filter CF2, and the third color filter CF3. The first color filter CF1 may overlap (or correspond to) the first light emitting area LA1, the second color filter CF2 may overlap the second light emitting area LA2, and the third color filter CF3 may overlap the third light emitting area LA3. In addition, the light blocking layer BM may partially overlap the color filter layer CF.

In an embodiment, the color filter layer CF may include a photochromic material that is discolored by light having a specific wavelength range. For example, the photochromic material may include azobenzene, diarylethene, spiropyran, and the like. These may be used alone or in combination with each other. However, the material of the photochromic material is not limited thereto. In an embodiment, the first color filter CF1, the second color filter CF2, and the third color filter CF3 may include different photochromic materials.

The photochromic material of the color filter layer CF may be discolored by the second light L2 (e.g., ultraviolet light) having a second wavelength range. Here, the second light L2 may denote external light incident from an outside of the display device 10. The photochromic material may not be discolored by the first light L1 (e.g., visible light) having the first wavelength range different from the second wavelength range.

When the photochromic material included in the color filter layer CF is discolored by the second light L2, the color filter layer CF transmits light in a partial wavelength range incident to the color filter layer CF, and blocks light in another wavelength ranges incident to the color filter layer CF. In addition, the color filter layer CF may block light reflected by external light incident from the outside of the display device 10.

For example, when the photochromic material included in the first color filter CF1 is not discolored by the second light L2, the first color filter CF1 may transmit the first light L1 (e.g., visible light). That is, the first color filter CF1 may be colorless, non-light filtering (e.g., unfaltering of color light), non-reflecting, etc. When the photochromic material included in the first color filter CF1 is discolored by the second light L2, the first color filter CF1 may represent red color. In this case, the first color filter CF1 may transmit red light, and may block green light and blue light. That is, the first color filter CF1 may be colored, light-filtering (e.g., filtering of color light), reflecting, etc.

When the photochromic material included in the second color filter CF2 is not discolored by the second light L2, the second color filter CF2 may transmit the first light L1. When the photochromic material included in the second color filter CF2 is discolored by the second light L2, the second color filter CF2 may represent green color. In this case, the second color filter CF2 may transmit green light, and may block red light and blue light.

When the photochromic material included in the third color filter CF3 is not discolored by the second light L2, the third color filter CF3 may transmit the first light L1. When the photochromic material included in the third color filter CF3 is discolored by the second light L2, the third color filter CF3 may represent blue color. In this case, the third color filter CF3 may transmit blue light, and may block red light and green light.

The planarization layer 140 may be disposed on the color filter layer CF and the light blocking layer BM. The planarization layer 140 may sufficiently cover the color filter layer CF. The planarization layer 140 may prevent the color filter layer CF from being exposed from external moisture or air. For example, the planarization layer 140 may include an organic insulating material or an inorganic insulating material.

The adhesive member 150 may be disposed on the planarization layer 140. The adhesive member 150 may be entirely disposed in the display area DA and the peripheral area PA. For example, the adhesive member 150 may include an optical clear adhesive (OCA), a pressure sensitive adhesive (PSA), a photocurable resin, a thermosetting resin, and the like. These may be used alone or in combination with each other.

The polarizing member POL may be disposed on the adhesive member 150. The polarizing member POL may be entirely disposed in the display area DA and the peripheral area PA. For, example, the polarizing member POL may be attached on the planarization layer 140 by the adhesive member 150. The polarizing member POL may block light reflected by external light incident from the outside of the display device 10.

The cover window CW may be disposed on the polarizing member POL. The cover window CW may be entirely disposed in the display area DA and the peripheral area PA. The cover window CW may serve to protect the substrate 100, the driving element 200, the encapsulation structure ENC, the light emitting element 300, and the like.

The cover window CW may include a transparent material. For example, the cover window CW may include an insulating material such as glass and plastic. Selectively, the cover window CW may include an organic polymer material such as polycarbonate (PC), polyethylene (PE), polypropylene (PP), and the like. An image may be viewable through the cover window CW, from the outside of the display device 10.

Hereinafter, operations of the display device 10 in the first mode state and the second mode state will be described with reference to FIGS. 2A and 2B.

When the display device 10 is located in the indoor environment, the display device 10 may be in the first mode state illustrated in FIG. 2A. In this case, the color filter layer CF may not be discolored. That is, when the display device 10 is in the first mode state, the color filter layer CF may display a transparent color (refer to the non-hatched color filters in FIG. 2A). The color filter layer CF may transmit the first light L1 (e.g., visible light). Here, the indoor environment may denote a darkroom environment in which there is little external light, no ultraviolet light, etc.

When the display device 10 is located in the outdoor environment, the display device 10 may be switched to the second mode state illustrated in FIG. 2B. In this case, the color filter layer CF may be discolored by external light (e.g., the second light L2) incident from the outside of the display device 10 (refer to the hatched color filters in FIG. 2B). That is, in the second mode state, the first color filter CF1 may represent red color, the second color filter CF2 may represent green color, and the third color filter CF3 may represent blue color. Accordingly, the color filter layer CF may further reduce reflectance due to external light incident from the outside of the display device 10. Here, the outdoor environment may denote an environment in which external light is sufficiently present, etc.

When the display device 10 is located again in the indoor environment, the color of the color filter layer CF may be restored to original state of the color filter layer CF. That is, the color filter layer CF may represent a transparent color again. That is, the color filter layer CF is color-changeable, color-filtering changeable or light-filtering changeable, according to a light incident thereto or a level of light external to the display device 10. For example, the color filter layer CF which is color unchanged, disposes various color filters of the color filter layer CF as transparent or unfiltering of color light. The color filter layer CF which is color-changed, disposes the various color filters of the color filter layer CF having a color, being discolored, being filtering of color light, being reflective of color light, etc.).

The display device 10 according to an embodiment may include the color filter layer CF including the photochromic material that is discolored by external light (e.g., ultraviolet light) incident from the outside of the display device 10. Accordingly, reflectance due to external light incident from the outside of the display device 10 may be further reduced.

Figure 3A:
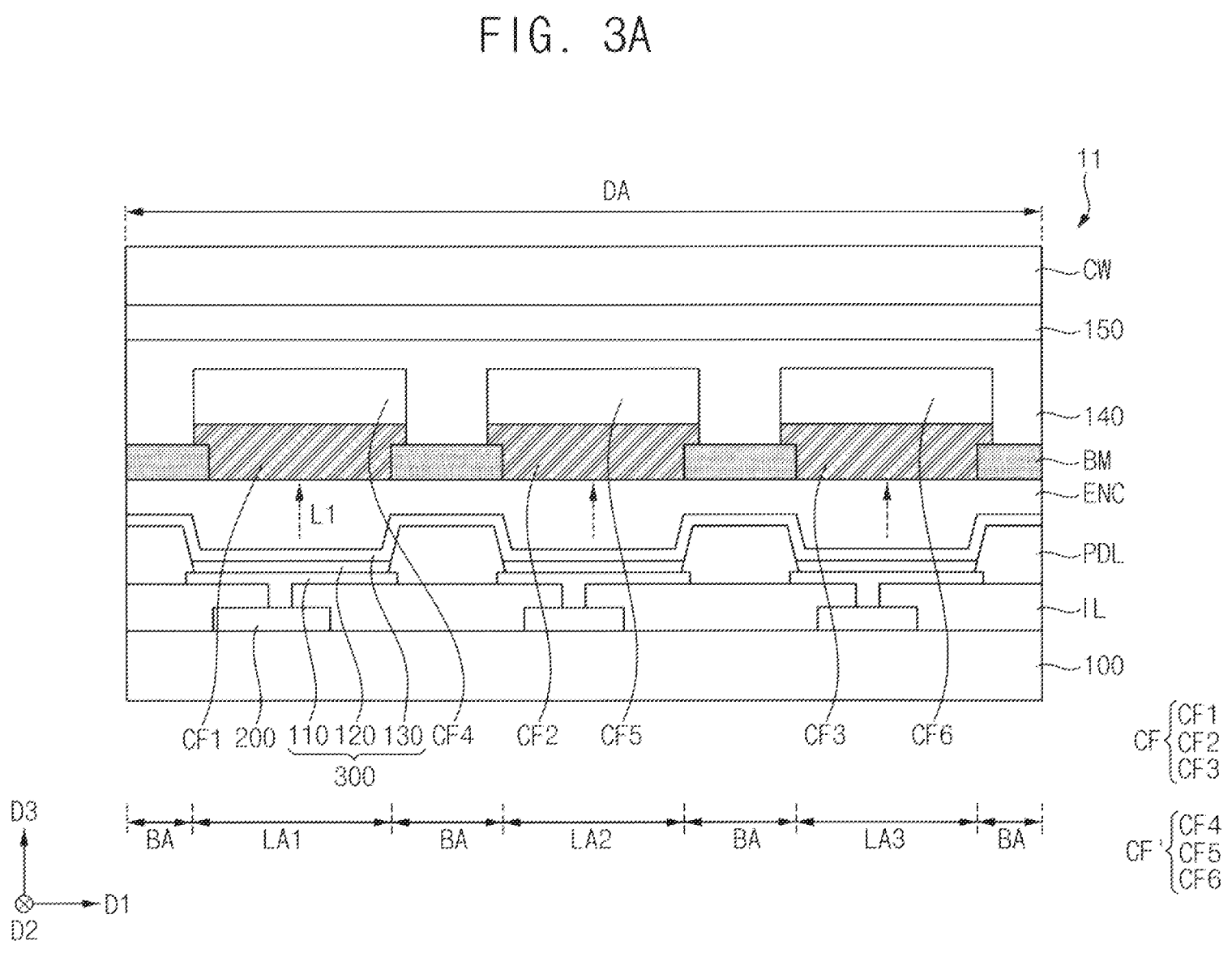
Figure 3B:
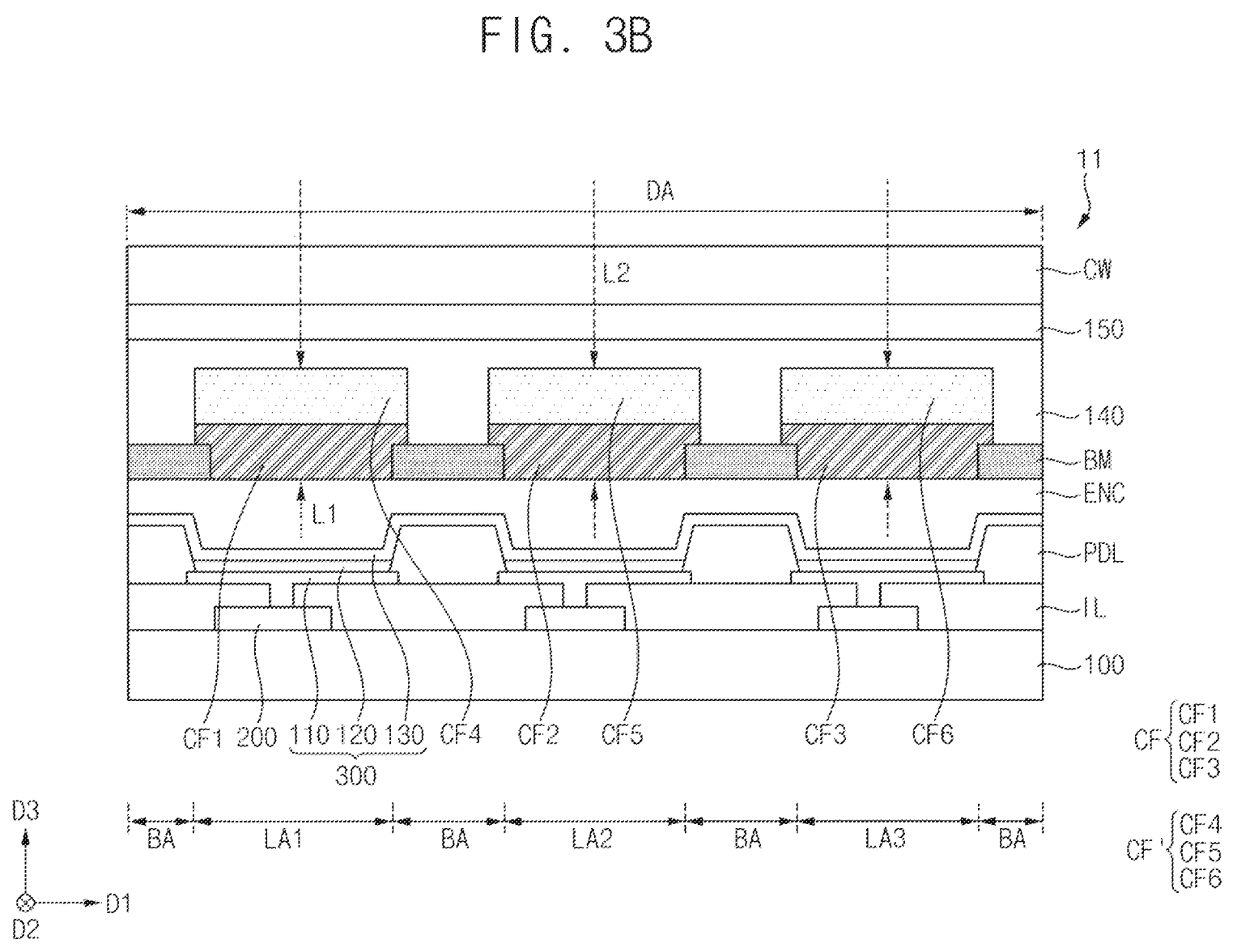

FIGS. 3A and 3B are cross-sectional views illustrating a display device 11 according to an embodiment. FIGS. 3A and 3B are cross-sectional views illustrating the display area DA of the display device 11.

For example, FIG. 3A may show the display device 11 in a first mode state, and FIG. 3B may show the display device 11 in a second mode state. Here, the first mode state may be a mode when the display device 11 is located in an indoor environment, and the second mode state may be a mode when the display device 11 is located in an outdoor environment.

Referring to FIGS. 1, 3A, and 3B, the display device 11 according to an embodiment may include the substrate 100, the insulating structure IL, the driving element 200, the pixel defining layer PDL, the light emitting element 300, the encapsulation structure ENC, a first color filter layer CF, a second color filter layer CF', the planarization layer 140, the adhesive member 150, and the cover window CW. However, in the display device 11 described with reference to FIGS. 3A and 3B, a description that overlaps with the display device 10 described with reference to FIGS. 2A and 2B will be omitted.

The first color filter layer CF may be disposed in the display area DA on the encapsulation structure ENC. The first color filter layer CF may be disposed in the first, second, and third light emitting areas LA1, LA2, and LA3. The first color filter layer CF may selectively transmit light having a specific wavelength. That is, various color filters of the first color filter layer CF have a color and are filtering of color light.

The first color filter layer CF may include a first color filter CF1, a second color filter CF2, and a third color filter CF3. The first color filter CF1 may overlap the first light emitting area LA1, the second color filter CF2 may overlap the second light emitting area LA2, and the third color filter CF3 may overlap the third light emitting area LA3.

The first color filter CF1 may transmit red light, and may block green light and blue light. For example, the first color filter CF1 may include a red pigment and/or a color filter composition including a red pigment.

The second color filter CF2 may transmit green light, and may block red light and blue light. For example, the second color filter CF2 may include a green pigment and/or a color filter composition including a green pigment.

The third color filter CF3 may transmit blue light, and may block red light and green light. For example, the third color filter CF3 may include a green pigment and/or a color filter composition including a green pigment.

The second color filter layer CF' may be disposed in the display area DA on the first color filter layer CF. The second color filter layer CF' may be disposed in the first, second, and third light emitting areas LA1, LA2, and LA3.

The second color filter layer CF' may include a fourth color filter CF4, a fifth color filter CF5, and a sixth color filter CF6. The fourth color filter CF4 may overlap the first light emitting area LA1, the fifth color filter CF5 may overlap the second light emitting area LA2, and the sixth color filter CF6 may overlap the third light emitting area LA3.

In an embodiment, the second color filter layer CF' may include a photochromic material that is discolored by light having a specific wavelength range. For example, the photochromic material may include azobenzene, diarylethene, spiropyran, and the like. These may be used alone or in combination with each other.

When the photochromic material included in the second color filter layer CF' is discolored by the second light L2, The second color filter layer CF' may transmit light in a partial wavelength range incident to the second color filter layer CF' and may block light in another wavelength ranges incident to the second color filter layer CF'. In addition, the second color filter layer CF' may block light reflected by external light incident from the outside of the display device 11.

That is, the second color filter layer CF' illustrated in FIGS. 3A and 3B may perform the same function as the color filter layer CF illustrated in FIGS. 2A and 2B except for the position of the second color filter layer CF'.

The planarization layer 140 may be disposed on the first color filter layer CF, the second color filter layer CF', and the light blocking layer BM. The planarization layer 140 may sufficiently cover the first color filter layer CF, the second color filter layer CF', and the light blocking layer BM. For example, the planarization layer 140 may include an organic insulating material or an inorganic insulating material.

In an embodiment, the display device 11 of the invention may not include a polarizing member POL. That is, the polarizing member POL may not be disposed on the substrate 100.

As shown in FIG. 3A, when the display device 11 is located in the indoor environment, the display device 11 may be in the first mode state. In this case, the second color filter layer CF' may not be discolored. Here, the indoor environment may denote a darkroom environment in which there is little external light.

As shown in FIG. 3B, when the display device 11 is located in the outdoor environment, the display device 11 may be in the second mode state. In this case, the second color filter layer CF' may be discolored by external light (e.g., the second light L2) incident from the outside of the display device 11. Accordingly, reflectance due to external light incident from the outside of the display device 11 may be further reduced. Here, the outdoor environment may denote an environment in which external light is sufficiently present.

Figure 4A:
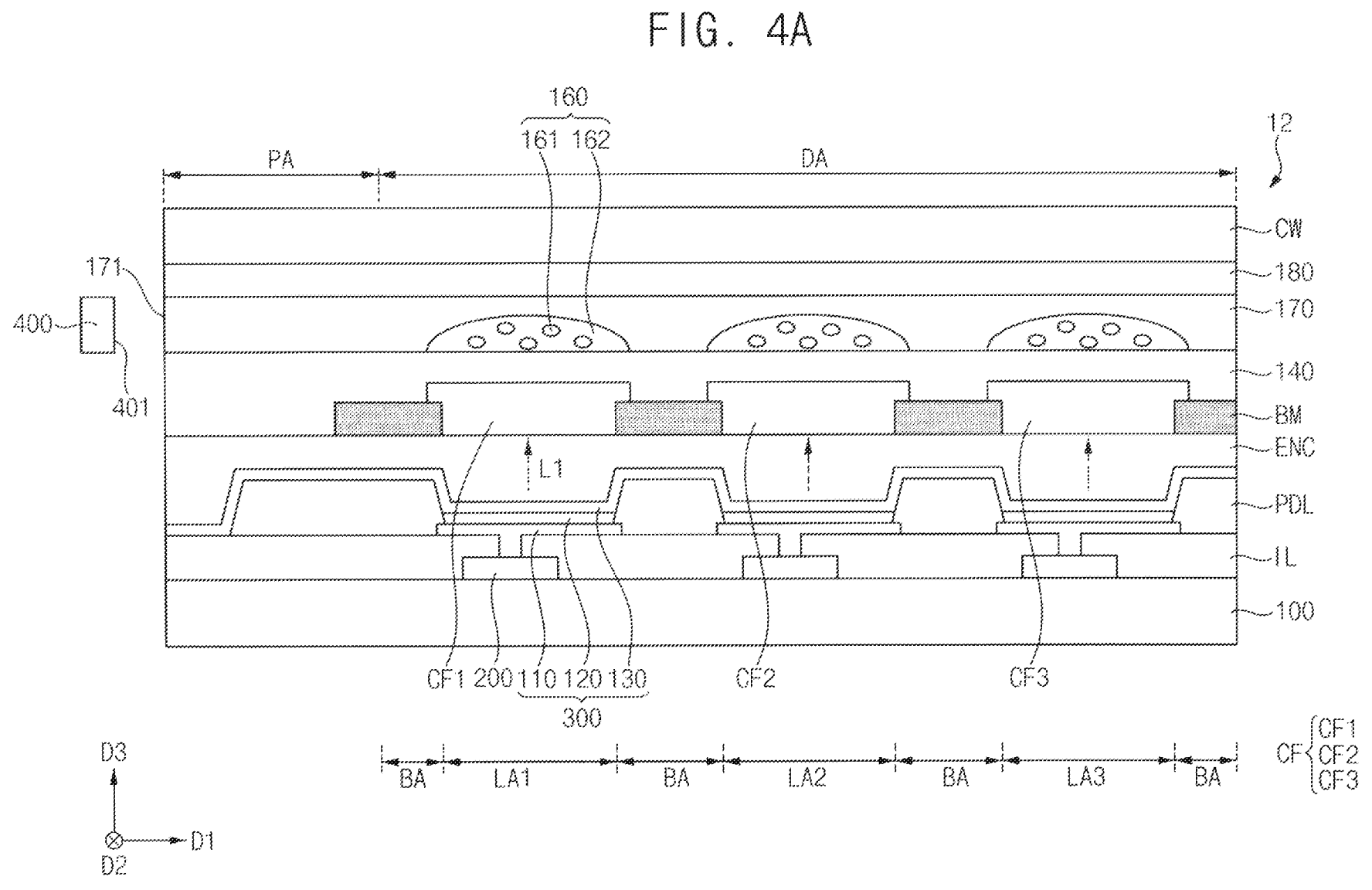
Figure 4B:
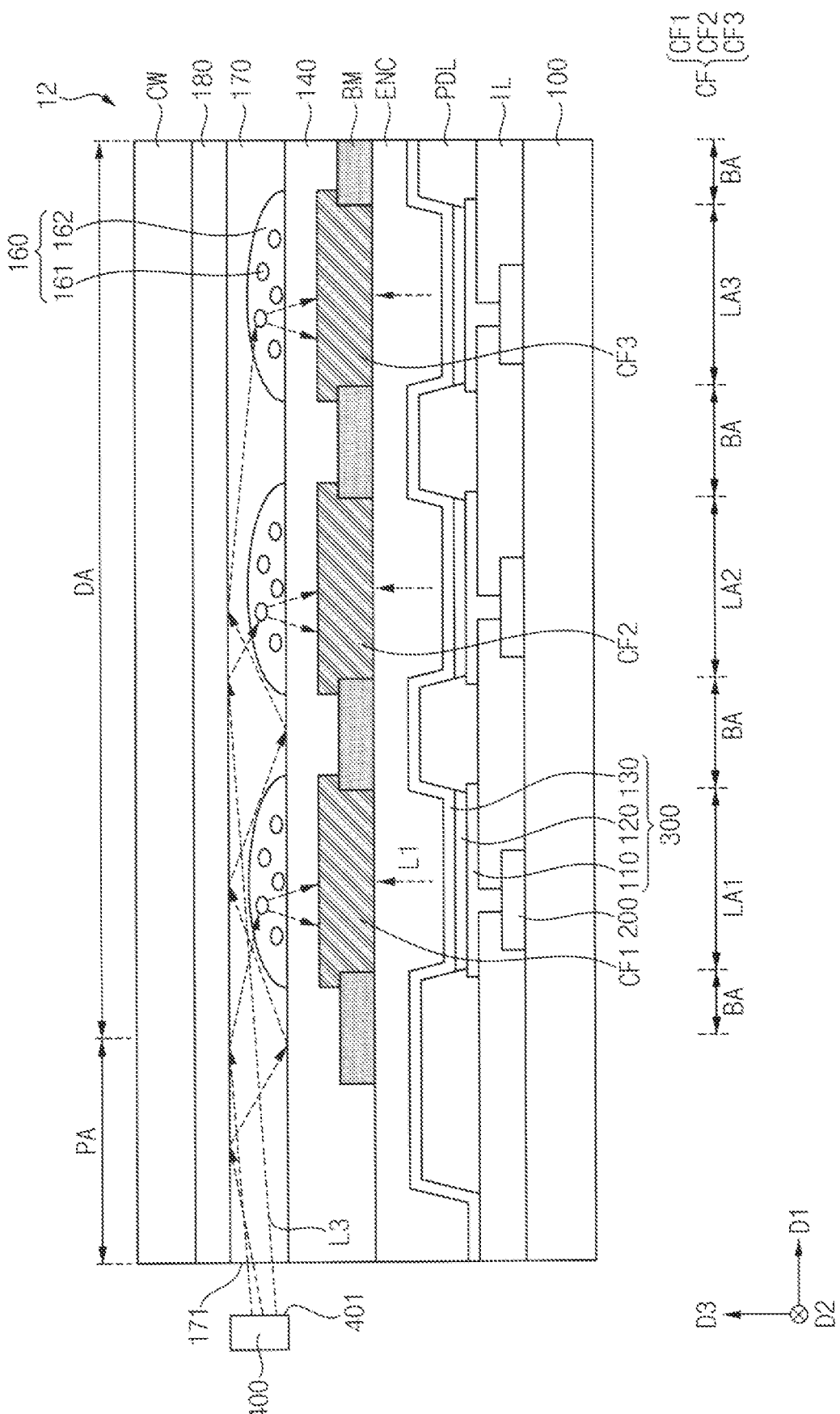

FIGS. 4A and 4B are cross-sectional views illustrating a display device 12 according to an embodiment. FIGS. 4A and 4B are cross-sectional views illustrating the display area DA and the peripheral area PA of the display device 12.

For example, FIG. 4A may show the display device 12 in a first mode state, and FIG. 4B may show the display device 12 in a second mode state. Here, the first mode state is a mode when the display device 12 is located in a first indoor environment, and the second mode state is a mode when the display device 12 is located in a second indoor environment or an outdoor environment.

Referring to FIGS. 4A, and 4B, the display device 12 according to an embodiment may include the substrate 100, the insulating structure IL, the driving element 200, the pixel defining layer PDL, the light emitting element 300, a light source element 400 (e.g., external light source), the encapsulation structure ENC, the light blocking layer BM, the color filter layer CF, the planarization layer 140, a scattering pattern 160 provided in plural including a plurality of scattering patterns 160 of a light scattering layer, a light guide layer 170, an adhesive member 180, and the cover window CW. Hereinafter, in the display device 12 described with reference to FIGS. 4A and 4B, a description that overlaps with the display device 10 described with reference to FIGS. 2A and 2B will be omitted.

The color filter layer CF may be disposed in the display area DA, on the encapsulation structure ENC. The color filter layer CF may include a first color filter CF1, a second color filter CF2, and a third color filter CF3. Each of the first color filter CF1, the second color filter CF2, and the third color filter CF3 may be disposed in each of the openings of the light blocking layer BM. The light blocking layer BM may partially overlap the color filter layer CF.

In an embodiment, the color filter layer CF may include a photochromic material that is discolored by light having a specific wavelength range. For example, the photochromic material may include azobenzene, diarylethene, spiropyran, and the like. These may be used alone or in combination with each other. For example, the photochromic material may be discolored by a third light L3 (e.g., ultraviolet light).

The light guide layer 170 may be disposed on the encapsulation structure ENC. The light guide layer 170 may be disposed on the planarization layer 140. The light guide layer 170 may be entirely disposed in the display area DA and the peripheral area PA. The light guide layer 170 may cover the scattering patterns 160. For example, as shown in FIG. 4B, when the display device 12 is in the second mode state, the light guide layer 170 may transmit and guide the third light L3 (e.g., ultraviolet light) incident from the peripheral area PA to the display area DA.

A display panel of the display device 12 may include layers from the substrate 100 through the cover window CW, without being limited thereto. In an embodiment, the light source element 400 may be disposed outside the display panel. The light source element 400 may be disposed on and/or facing at least one side of the light guide layer 170. For example, the light source element 400 may be disposed on the side of the light guide layer 170, such as to be coplanar therewith. A light emitting surface 401 of the light source element 400 may face an incident side surface 171 of the light guide layer 170 exposed to an outside of the display device 12. For example, the light source element 400 and the display panel may be fixed relative to each other by a housing (not shown) of the display device 12.

The light source element 400 may emit the third light L3 having a third wavelength range. The third wavelength range may be the same as the second wavelength range. That is, the third light L3 may be an ultraviolet light.

The light source element 400 may selectively emit the third light L3 in the second mode state. That is, in the first mode state, the third light L3 may not be emitted from the light source element 400 and only the first light L1 may be emitted from the light emitting element 300, and in the second mode state, the third light L3 may be emitted from the light source element 400 in addition to the first light L1 being emitted from the light emitting element 300. That is, the display device 12 may include a light source provided in plural including the light source element 400 and the light emitting element 300. The third light L3 may be emitted from the light emitting surface 401 of the light source element 400 in (or along) the first direction D1 and may be incident into the light guide layer 170 through the incident side surface 171 of the light guide layer 170. The third light L3 incident into the light guide layer 170 may be transmitted to the display area DA by total reflection.

The scattering patterns 160 may be disposed between the encapsulation structure ENC and the light guide layer 170. The scattering patterns 160 may be disposed between the planarization layer 140 and the light guide layer 170. The scattering patterns 160 may overlap the color filter layer CF.

The scattering patterns 160 may respectively overlap each of the first color filter CF1, the second color filter CF2, and the third color filter CF3. For example, an upper surface of each of the scattering patterns 160 which is furthest from the light emitting element 300, may have a convex shape in a cross-section and in a direction away from the light emitting element 300.

As shown in FIG. 4B, at least a portion of the third light L3 transmitted in the first direction D1 from the inside of the light guide layer 170 may proceed to the scattering patterns 160. A portion of the third light L3 that proceeds to the scattering patterns 160 may be scattered by the scattering patterns 160. Accordingly, a portion of the third light L3 may be emitted to an outside of the light guide layer 170 (e.g., to the color filter layer CF) without being totally reflected inside the light guide layer 170. Another portion of the third light L3 that is not emitted to the outside of the light guide layer 170 may be transmitted in the first direction D1 by total reflection within the light guide layer 170.

In an embodiment, each of the scattering patterns 160 may include a plurality of light scattering particles 161 and an insulating film 162 in which the light scattering particles 161 are disposed. For example, each of the light scattering particles 161 may include titanium oxide ($TiO_x$) and the like. In addition, the insulating film 162 may include an organic insulating material or the like.

The adhesive member 180 may be disposed in the display area DA and the peripheral area PA, on the light guide layer 170. The cover window CW may be disposed in the display area DA and the peripheral area PA, on the adhesive member 180.

Hereinafter, operations of the display device 12 in the first mode state and the second mode state will be described with reference to FIGS. 4A and 4B.

When the display device 12 is located in the first indoor environment, the display device 12 may be in the first mode state illustrated in FIG. 4A. In this case, the third light L3 (e.g., ultraviolet light) may not be emitted from the light source element 400. Accordingly, the color filter layer CF may not be discolored. That is, when the display device 12 is in the first mode state, the color filter layer CF may represent a transparent color. In this case, the display device 12 may be driven with a luminance of about 20 nit or less. Accordingly, power consumption of the display device 12 may be reduced. Here, the first indoor environment may denote a darkroom environment in which there is little external light.

When the display device 12 is located in the second indoor environment, the display device 12 may be in the second mode state illustrated in FIG. 4B. In this case, the third light L3 may be emitted from the light source element 400. The third light L3 may be transmitted to the display area DA through the light guide layer 170, and a portion of the third light L3 may be emitted to the color filter layer CF by the scattering patterns 160. Accordingly, the color filter layer CF may be discolored by the third light L3. That is, when the display device 12 is in the second mode state, the first color filter CF1 may represent red color, the second color filter CF2 may represent green color, and the third color filter CF3 may represent blue color. In this case, the display device 12 may be driven with a luminance of about 100 nit to about 300 nit. Here, the second indoor environment may denote an environment in which external light is slightly present.

When the display device 12 is located in the outdoor environment, the display device 12 may be in the second mode state illustrated in FIG. 4B. In this case, the third light L3 may be emitted from the light source element 400. The third light L3 may be transmitted to the display area DA through the light guide layer 170, and a portion of the third light L3 may be emitted to the color filter layer CF by the scattering patterns 160. Accordingly, the color filter layer CF may be further discolored by the third light L3. That is, when the display device 12 is in the second mode state, the first color filter CF1 may represent red color, the second color filter CF2 may represent green color, and the third color filter CF3 may represent blue color. In this case, the display device 12 may be driven with a luminance of about 700 nit. Here, the outdoor environment may denote an environment in which external light is sufficiently present. Accordingly, reflectance due to external light incident from the outside of the display device 12 may be further reduced.

In the second mode state, the degree of discoloration of the color filter layer CF when the display device 12 is located in the second indoor environment and the degree of discoloration of the color filter layer CF when display device 12 is located in the outdoor environment may be different. That is, the color filter layer CF may be discolored or decolored based on the external illuminance sensed by an illumination sensor 1100 (of FIG. 8).

Figure 5:
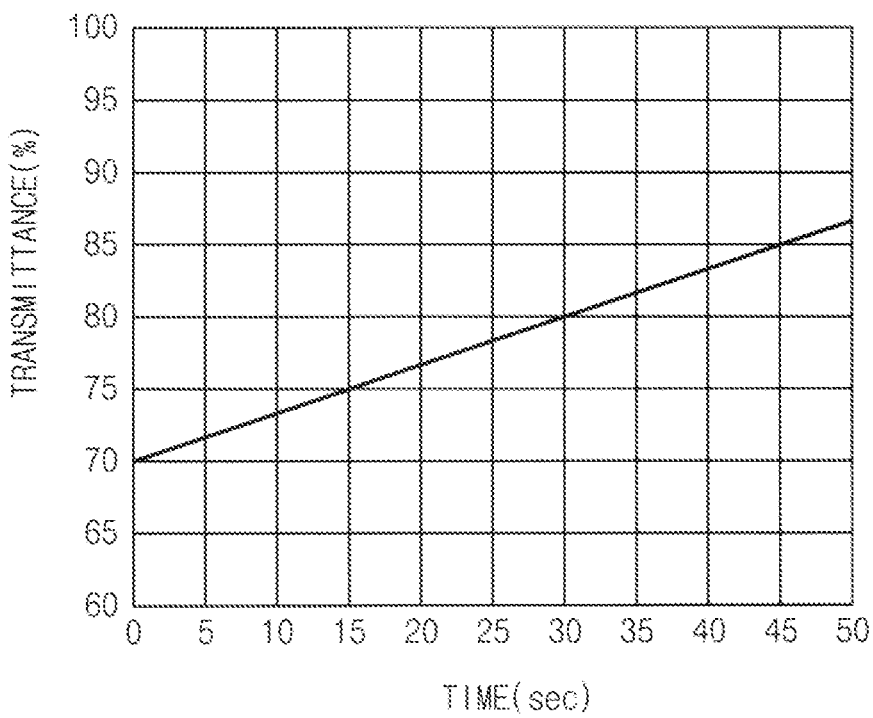
FIG. 5 is a diagram illustrating transmittance of a color filter layer according to time in the second mode state of FIG. 4B.

FIG. 5 is a diagram illustrating transmittance of a color filter layer CF according to time (in seconds (sec)) in the second mode state of FIG. 4B.

Referring to FIG. 5, when the display device 12 moves from the outdoor environment to the first indoor environment or to the second indoor environment, the color filter layer CF may be gradually decolored. In this case, the luminance of the display device 12 may be adjusted to correspond to the transmittance of the color filter layer CF. Hereinafter, an example of a process in which the color filter layer CF is gradually decolored will be described.

First, when the display device 12 is located in the outdoor environment, the power of the light source element 400 is maximized. At this time, the display device 12 was driven with a luminance of about 500 nit.

Then, the display device 12 is moved to the second indoor environment, and the power of the light source element 400 is set to ⅓ of the maximum value. At this time, the transmittance of the color filter layer CF was about 70%, and the display device 12 was driven with a luminance of about 250 nit. After 10 seconds, the transmittance of the color filter layer CF was about 73%, and the display device 12 was driven with a luminance of about 230 nit. After 20 seconds, the transmittance of the color filter layer CF was about 77%, and the display device 12 was driven with a luminance of about 210 nit. After 40 seconds, the transmittance of the color filter layer CF was about 83%, and the display device 12 was driven with a luminance of about 200 nit. In the above method, the luminance of the display device 12 may be adjusted according to the transmittance of the color filter layer CF. Accordingly, the color filter layer CF may be gradually decolored.

Figure 6A:
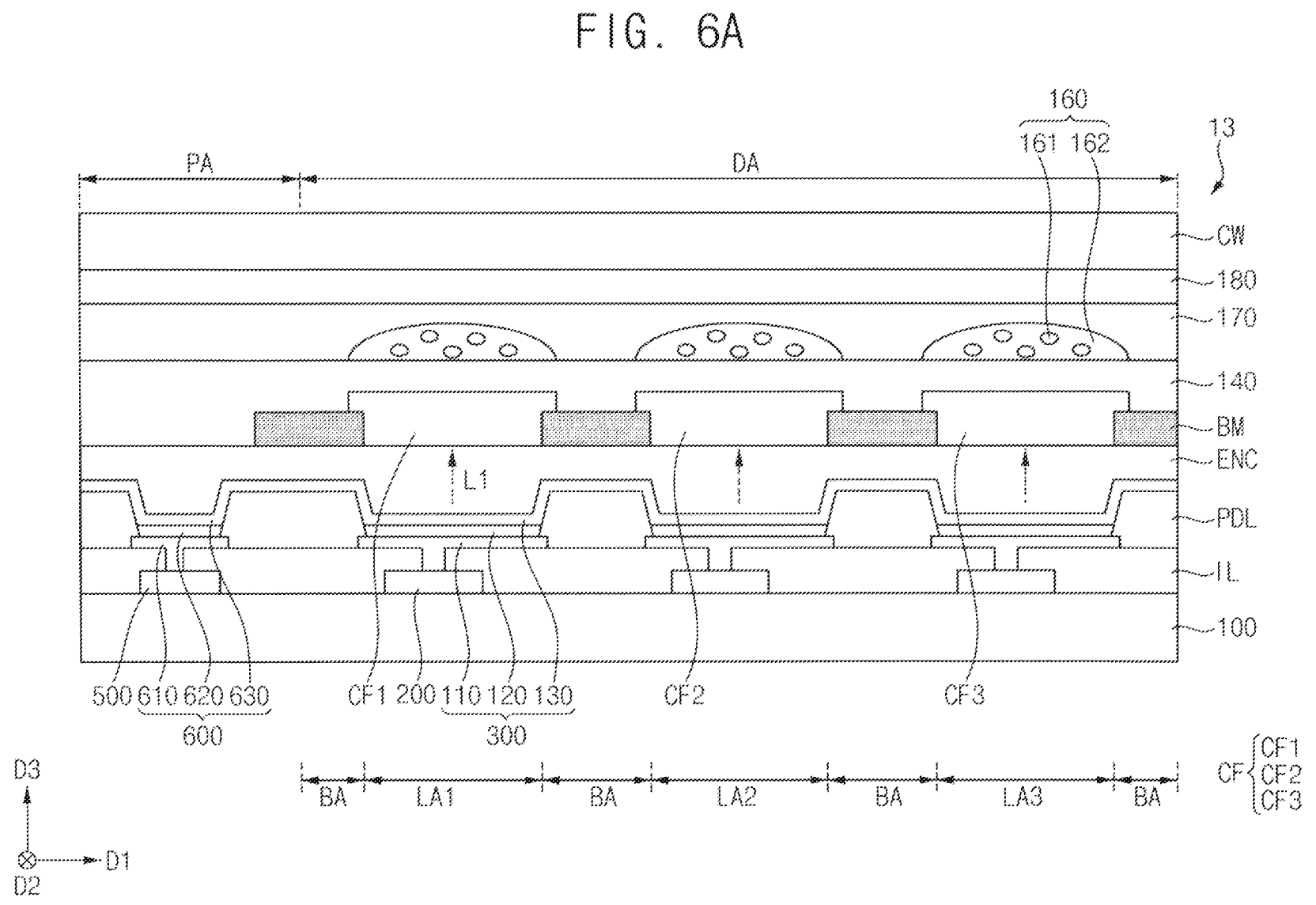
Figure 6B:
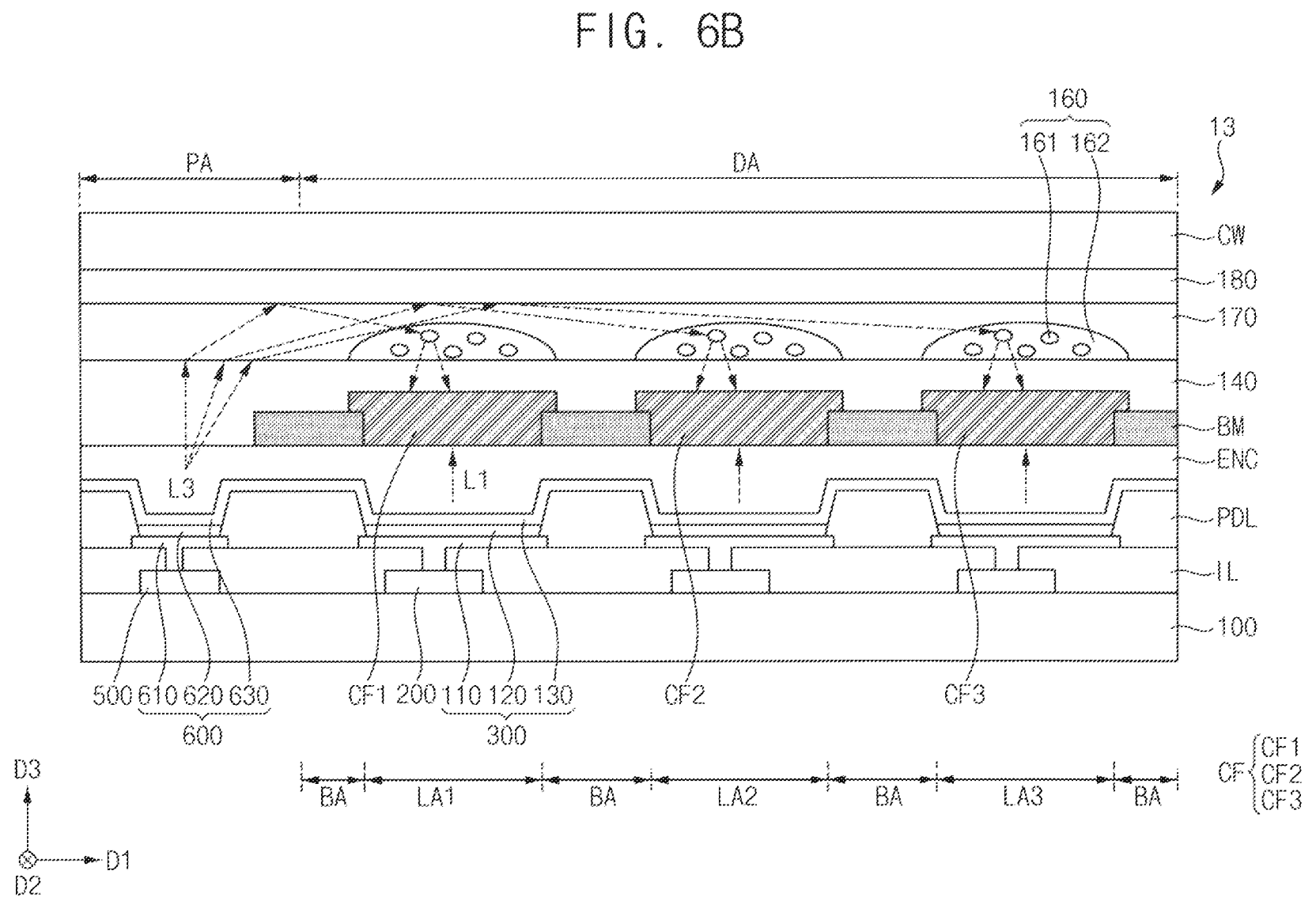

FIGS. 6A and 6B are cross-sectional views illustrating a display device 13 according to an embodiment. FIGS. 6A and 6B are cross-sectional views illustrating the display area DA and the peripheral area PA of the display device 13.

For example, FIG. 6A may show the display device 13 in a first mode state, and FIG. 6B may show the display device 13 in a second mode state. Here, the first mode state is a mode when the display device 13 is located in a first indoor environment, and the second mode state is a mode when the display device 13 is located in a second indoor environment or an outdoor environment.

Referring to FIGS. 6A, and 6B, the display device 13 according to an embodiment may include the substrate 100, the insulating structure IL, a first driving element 200, a second driving element 500, the pixel defining layer PDL, the light emitting element 300 (e.g., a first light emitting element), a light source element 600 (e.g., a second light emitting element or internal light source), the encapsulation structure ENC, the light blocking layer BM, the color filter layer CF, the planarization layer 140, the scattering patterns 160, the light guide layer 170, the adhesive member 180, and the cover window CW. Here, the light emitting element 300 may include a first lower electrode 110, a first light emitting layer 120, and a first upper electrode 130. The light source element 600 may include a second lower electrode 610, a second light emitting layer 620 and a second upper electrode 630. Hereinafter, in the display device 13 described with reference to FIGS. 6A and 6B, a description that overlaps with the display device 12 described with reference to FIGS. 4A and 4B will be omitted.

The second driving element 500 may be disposed in the peripheral area PA on the substrate 100. In an embodiment, a semiconductor layer of the second driving element 500 may include amorphous silicon, polycrystalline silicon, or a metal oxide semiconductor.

The second lower electrode 610 may be disposed in the peripheral area PA, on the insulating structure IL. The second lower electrode 610 may be electrically connected to the second driving element 500. For example, the second lower electrode 610 may include a metal, an alloy, a conductive metal oxide, a conductive metal nitride, a transparent conductive material, and the like. These may be used alone or in combination with each other.

The second light emitting layer 620 may be disposed on the second lower electrode 610. The second light emitting layer 620 may be disposed in the opening of the pixel defining layer PDL. The second light emitting layer 620 may include an organic light emitting material emitting the third light L3 having the third wavelength range.

The second upper electrode 630 may be disposed in the peripheral area PA on the second emission layer 620. The second upper electrode 630 may be integrally formed with the first upper electrode 130. In this case, the first upper electrode 130 and the second upper electrode 630 may be entirely formed in the display area DA and the peripheral area PA. For example, the second upper electrode 630 may include a metal, an alloy, a conductive metal oxide, a conductive metal nitride, a transparent conductive material, and the like. These may be used alone or in combination with each other.

Accordingly, the light source element 600 including the second lower electrode 610, the second light emitting layer 620, and the second upper electrode 630 may be disposed in the peripheral area PA of the substrate 100. The light source element 600 may be outside the display area DA. The light source element 600 may emit the third light L3 having the third wavelength range. The third light L3 may be ultraviolet light. The light source element 600 may be formed using some of dummy pixels formed in the peripheral area PA during the manufacturing process of the display device 13.

The light source element 600 may be connected to and driven by the second driving element 500. That is, the light source element 600 emitting the third light L3 may be driven independently of the light emitting element 300 emitting the first light L1. For example, the second driving element 500 does not drive the light source element 600 when the display device 13 is in the first mode state, and may drive the light source element 600 when the display device 13 is in the second mode state.

As shown in FIG. 6A, when the display device 13 is located in the first indoor environment, the display device 13 may be in the first mode state. In this case, the color filter layer CF may not be discolored. Accordingly, power consumption of the display device 13 may be reduced. Here, the first indoor environment may denote a darkroom environment in which there is little external light.

As shown in FIG. 6B, when the display device 13 is located in the second indoor environment or the outdoor environment, the display device 13 may be in the second mode state. In this case, the color filter layer CF may be discolored. Accordingly, reflectance due to external light incident from the outside of the display device 13 may be further reduced. Here, the second indoor environment may denote an environment in which external light is slightly present, and the outdoor environment may denote an environment in which external light is sufficiently present.

Figure 7A:
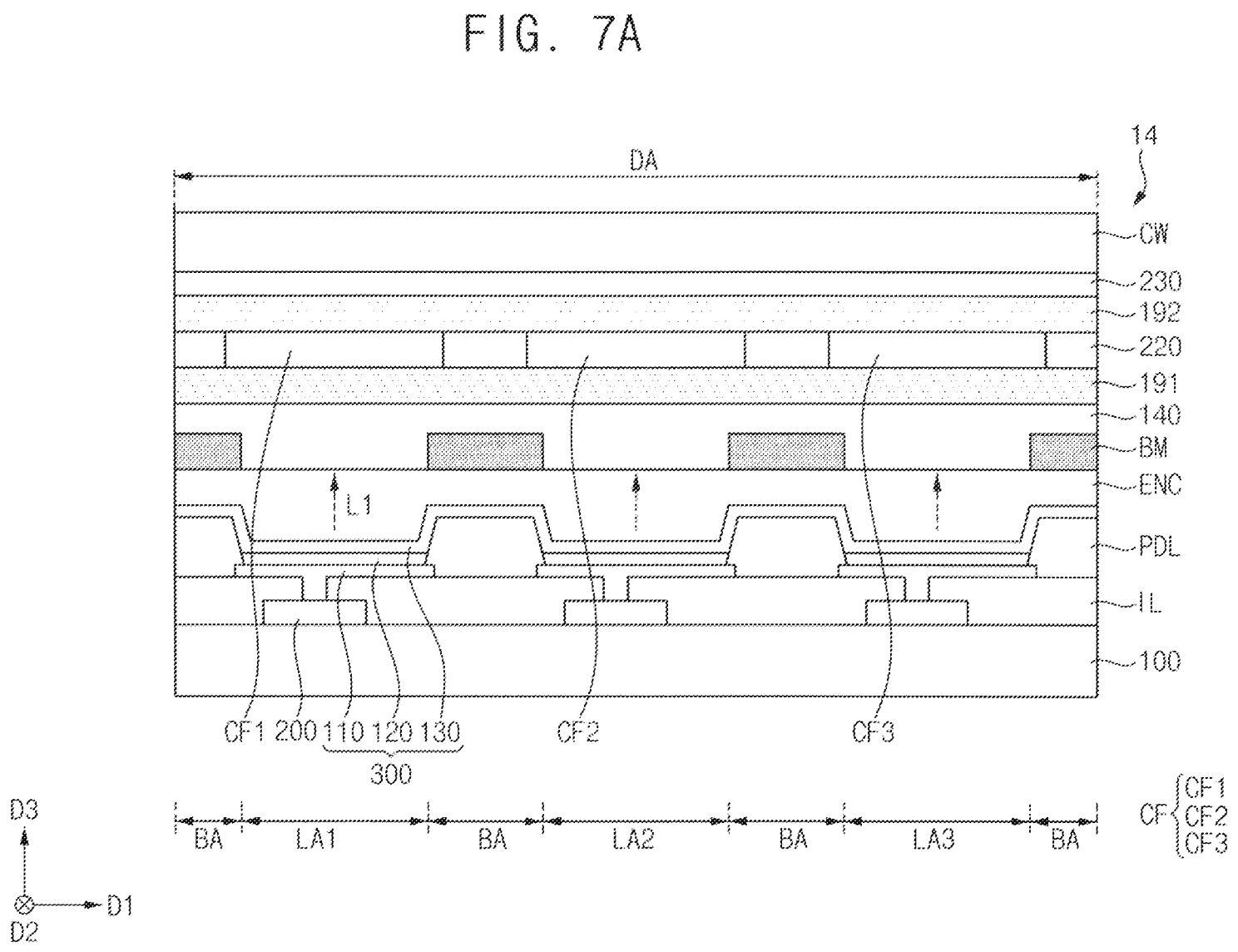
Figure 7B:
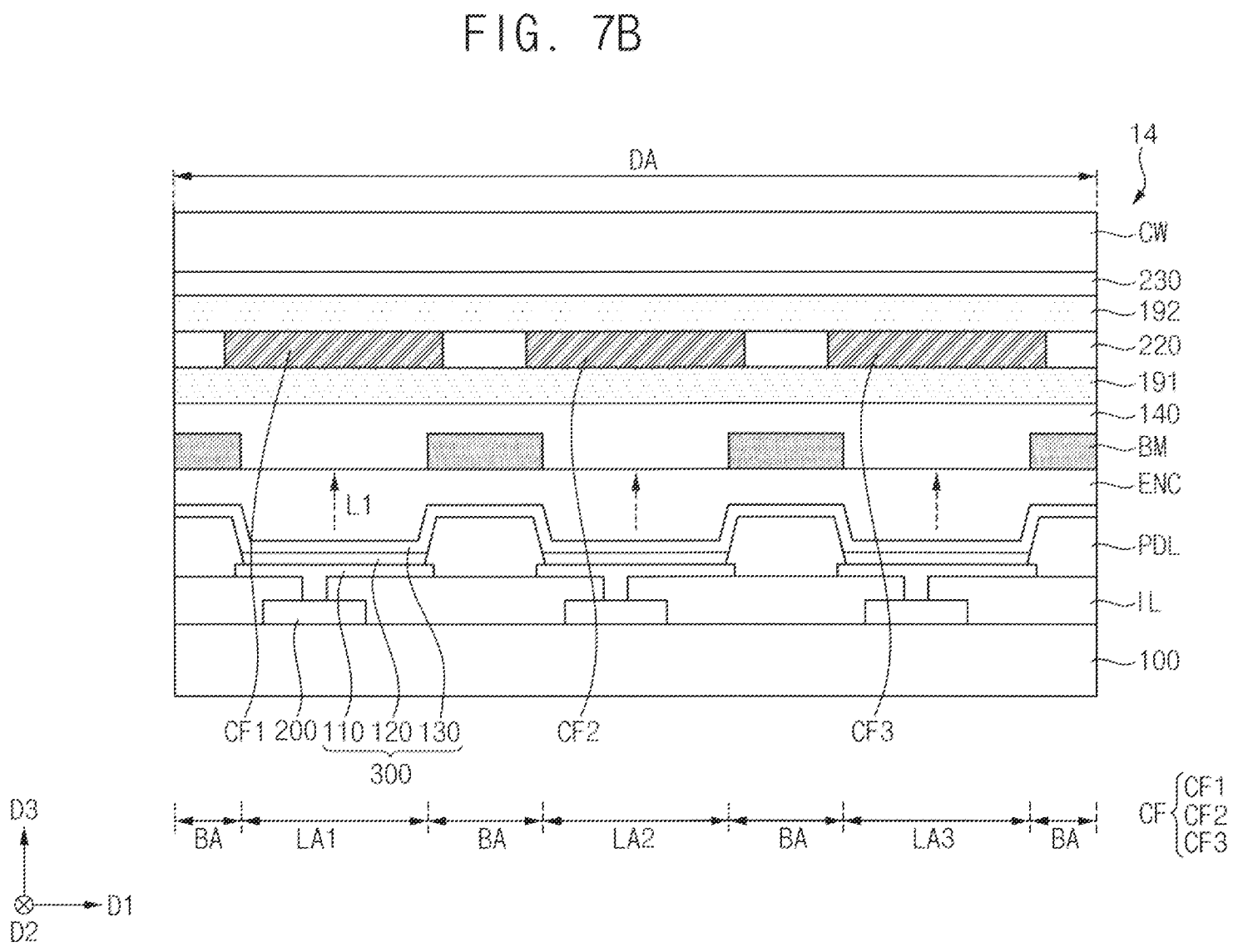

FIGS. 7A and 7B are cross-sectional views illustrating a display device 14 according to an embodiment. FIGS. 7A and 7B are cross-sectional views illustrating the display area DA of the display device 14.

For example, FIG. 7A may show the display device 14 in a first mode state, and FIG. 7B may show the display device 14 in a second mode state. Here, the first mode state is a mode when the display device 14 is located in a first indoor environment, and the second mode state is a mode when the display device 14 is located in a second indoor environment or an outdoor environment.

Referring to FIGS. 1, 7A, and 7B, the display device 14 according to an embodiment may include the substrate 100, the insulating structure IL, the driving element 200, the pixel defining layer PDL, the light emitting element 300, the encapsulation structure ENC, the light blocking layer BM, a color filter layer CF, a first electrode 191, a second electrode 192, the planarization layer 140, partition walls 220, an adhesive member 230 and the cover window CW. Hereinafter, in the display device 14 described with reference to FIGS. 7A and 7B, a description that overlaps with the display device 10 described with reference to FIGS. 2A and 2B and the display device 12 described with reference to FIGS. 4A and 4B will be omitted.

The planarization layer 140 may be disposed on the encapsulation structure ENC. The planarization layer 140 may cover the light blocking layer BM. In an embodiment, the first electrode 191 may be disposed in the display area DA on the planarization layer 140, and the second electrode 192 may be disposed in the display area DA on the first electrode 191. For example, each of the first electrode 191 and the second electrode 192 may include a transparent conductive material. Examples of the transparent conductive material include aluminum oxide, tungsten oxide, magnesium oxide, indium tin oxide, indium zinc oxide, and the like. These may be used alone or in combination with each other.

The color filter layer CF may be disposed in the display area DA between the first electrode 191 and the second electrode 192. The color filter layer CF may include a first color filter CF1 overlapping the first light emitting area LA1, a second color filter CF2 overlapping the second light emitting area LA2, and a third color filter CF3 overlapping the third light emitting area LA3.

In an embodiment, the color filter layer CF may include an electrochromic material that is discolored by a voltage. Each of the first electrode 191 and the second electrode 192 may apply a voltage to the color filter layer CF. For example, as shown in FIG. 7B, when a voltage is applied to the color filter layer CF, the color filter layer CF may represent predetermined colors (e.g., red, green, and blue). As shown in FIG. 7A, when no voltage is applied to the color filter layer CF, the color filter layer CF may represent a transparent color. Selectively, when a voltage is applied to the color filter layer CF, the color filter layer CF may represent a transparent color, and when no voltage is applied to the color filter layer CF, the color filter layer CF may represent a predetermined color.

For example, the electrochromic material may include an organic material such as viologen. Selectively, the electrochromic material may include an inorganic material such as $WO_3$, $MO_3$, $TIO_3$, $V_2O_5$, $IrO_2$, $Nb_2O_5$, NiO, and the like. These may be used alone or in combination with each other.

The partition walls 220 may be disposed in the light blocking area BA between the first electrode 191 and the second electrode 192. In detail, the partition walls 220 may be respectively disposed between the first color filter CF1, the second color filter CF2, and the third color filter CF3 which are spaced apart from each other along the planarization layer 140. For example, each of the partition walls 220 may include an organic material or an inorganic material.

As shown in FIG. 7A, when the display device 14 is located in the first indoor environment, the display device 14 may be in the first mode state. In this case, the color filter layer CF may not be discolored. Accordingly, power consumption of the display device 14 may be reduced. Here, the first indoor environment may denote a darkroom environment in which there is little external light.

As shown in FIG. 7B, when the display device 14 is located in the second indoor environment or the outdoor environment, the display device 14 may be in the second mode state. In this case, the color filter layer CF may be discolored by a voltage applied by the first electrode 191 and the second electrode 192. Accordingly, reflectance due to external light incident from the outside of the display device 14 may be further reduced. Here, the second indoor environment may denote an environment in which external light is slightly present, and the outdoor environment may denote an environment in which external light is sufficiently present.

In an embodiment, the color filter layer CF including the electrochromic material is color-changeable, according to a voltage applied thereto from the electrodes. For example, the color filter layer CF which is color unchanged, disposes various color filters of the color filter layer CF as transparent. The color filter layer CF which is color-changed, disposes the various color filters of the color filter layer CF having a color or being discolored.

Figure 8:
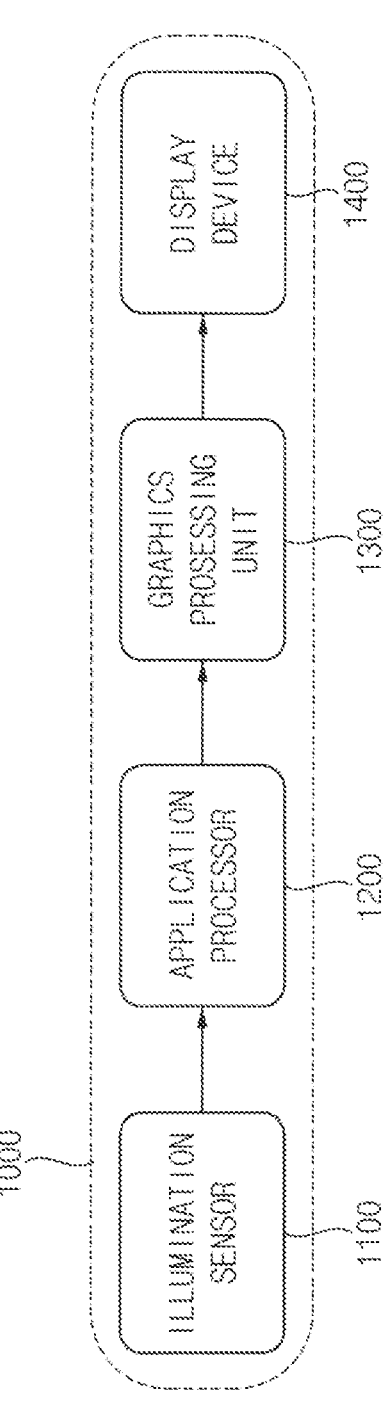
FIG. 8 is a block diagram illustrating an electronic device including a display device according to an embodiment.

FIG. 8 is a block diagram illustrating an electronic device 1000 including a display device 1400 according to an embodiment.

For example, the display device 1400 illustrated in FIG. 8 may correspond to the display device 12 described with reference to FIGS. 4A and 4B. Alternatively, the display device 1400 illustrated in FIG. 8 may correspond to the display device 13 described with reference to FIGS. 6A and 6B. Alternatively, the display device 1400 illustrated in FIG. 8 may correspond to the display device 14 described with reference to FIGS. 7A and 7B.

Referring to FIG. 8, the electronic device 1000 according to an embodiment of the invention may include an illumination sensor 1100, an application processor (AP) 1200, a graphics processing unit (GPU) 1300 as a graphics processor, and the display device 1400.

The electronic device 1000 may be implemented as a television, a smart phone, or the like. However, the electronic device 1000 is not limited thereto. For example, the electronic device 1000 may be implemented as a mobile phone, a video phone, a smart pad, a smart watch, a tablet PC, a vehicle navigation system, a computer monitor, a notebook computer, a head mounted display (HMD), or the like.

The illumination sensor 1100 may detect external illuminance relative to the electronic device 1000. The color filter layer CF (of FIGS. 4B, 6B and 7B) may be discolored based on the external illuminance sensed by the illumination sensor 1100. In addition, each of the application processor 1200 and the graphics processing unit 1300 may perform specific calculations or tasks. For example, the graphics processing unit 1300 may determine a mode (e.g., the first mode state or the second mode state) of the display device 1400. In an embodiment, the illumination sensor 1100 may detect a level of external illuminance relative to the electronic device 1000. A processor (e.g., the application processor 1200, the graphics processing unit 1300, etc.) may perform specific calculations or tasks using the detected level of external illuminance as input. The processor may control the electronic device 1000 to affect a color change of the color filter layer CF. For example, where little external light, no ultraviolet light, etc. is detected by the illumination sensor 1100, the processor may control the color filter layer CF to be transparent or colorless. In contrast, where sufficient external light is detected by the illumination sensor 1100, the processor may control the color filter layer CF to be colored/discolored, non-transparent, non-opaque, etc.

The present disclosure can be applied to various electronic devices that may include one or more display device described herein. For example, the present disclosure can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A display device comprising:
a display area including a light emitting area and a light blocking area which is adjacent to the light emitting area;
a peripheral area adjacent to the display area;
a first light emitting element which is in the light emitting area and emits a first light having a first wavelength range; and
a photochromic material which is in the light emitting area, wherein the photochromic material discolored by a second light which is incident from outside of the display device and having a second wavelength range different from the first wavelength range defines a color filter layer in the light emitting area which transmits the first light having the first wavelength range, and
wherein only when the display device is located in an indoor environment the color filter layer represents a transparent color.

2. The display device of claim 1, further comprising:
a polarizing member in the display area and the peripheral area and facing the first light emitting element with the color filter layer therebetween.

3. The display device of claim 2, wherein
the first light which is emitted by the first light emitting element is visible light, and
the second light which discolors the photochromic material is ultraviolet light incident from the outside of the display device.

4. The display device of claim 1, further comprising:
a light guide layer which is in the display area and the peripheral area and facing the first light emitting element with the color filter layer therebetween,
wherein
the second light is incident from the peripheral area, and
the light guide layer transmits the second light from the peripheral area to the display area.

5. The display device of claim 4, further comprising:
an encapsulation structure which is in the display area and the peripheral area and between the color filter layer and the first light emitting element; and
a light blocking layer which is in the light blocking area and between the encapsulation structure and the color filter layer.

6. The display device of claim 5, further comprising:
a light scattering layer including a plurality of scattering patterns between the encapsulation structure and the light guide layer, and overlapping the color filter layer.

7. The display device of claim 6, wherein each of the plurality of scattering patterns includes a plurality of light scattering particles, and an insulating film in which the plurality of light scattering particles are disposed.

8. The display device of claim 4, wherein
the light guide layer includes an incident side surface exposed to the outside of the display device, and
the display device further comprises a second light emitting element which emits the second light and faces the incident side surface of the light guide layer.

9. The display device of claim 8, wherein
the first light which is emitted by the first light emitting element is visible light, and
the second light which discolors the photochromic material is ultraviolet light incident from the second light emitting element.

10. The display device of claim 4, further comprising:
a second light emitting element which is in the peripheral area and emits the second light,
wherein
the first light which is emitted by the first light emitting element is visible light, and
the second light which discolors the photochromic material is ultraviolet light incident from the second light emitting element.

* * * * *